United States Patent
Kanarek

(10) Patent No.: US 10,197,630 B2
(45) Date of Patent: Feb. 5, 2019

(54) WIRELESS SMART BATTERY SYSTEM

(71) Applicant: Ross Kanarek, Great Neck, NY (US)

(72) Inventor: Ross Kanarek, Great Neck, NY (US)

( * ) Notice: Subject to any disclaimer, the term of this patent is extended or adjusted under 35 U.S.C. 154(b) by 343 days.

(21) Appl. No.: 14/683,584

(22) Filed: Apr. 10, 2015

(65) Prior Publication Data

US 2016/0299194 A1    Oct. 13, 2016

(51) Int. Cl.
*H02J 7/00* (2006.01)
*G01R 31/36* (2006.01)
*H01M 10/42* (2006.01)
*H01M 10/48* (2006.01)

(52) U.S. Cl.
CPC .... *G01R 31/3648* (2013.01); *H01M 10/4257* (2013.01); *H01M 10/48* (2013.01); *H02J 7/0045* (2013.01); *H02J 2007/0096* (2013.01); *H02J 2007/0098* (2013.01)

(58) Field of Classification Search
CPC .......... H01M 10/4257; H01M 10/4278; H02J 7/0045; H02J 2007/0096; H02J 2007/0098
USPC ......................................................... 320/107
See application file for complete search history.

(56) References Cited

U.S. PATENT DOCUMENTS

| | | | | |
|---|---|---|---|---|
| 9,781,496 B2 * | 10/2017 | Conrad | ..................... | H04R 1/00 |
| 2010/0254696 A1 * | 10/2010 | McKay | .................. | F16M 13/04 |
| | | | | 396/420 |
| 2012/0306450 A1 * | 12/2012 | Nakayama | .............. | G06F 1/263 |
| | | | | 320/134 |
| 2013/0057076 A1 * | 3/2013 | Lavender | .................. | H02J 1/10 |
| | | | | 307/80 |
| 2014/0361740 A1 * | 12/2014 | Suzuki | .................. | H02J 7/0027 |
| | | | | 320/108 |
| 2015/0035473 A1 * | 2/2015 | Zhou | ..................... | H02J 7/0052 |
| | | | | 320/103 |
| 2015/0061603 A1 * | 3/2015 | Loftus | ................ | G01R 31/3606 |
| | | | | 320/137 |
| 2016/0006280 A1 * | 1/2016 | Ikeda | ................ | G01R 31/3606 |
| | | | | 320/107 |
| 2016/0126758 A1 * | 5/2016 | Wu | ....................... | H02J 7/0029 |
| | | | | 320/162 |
| 2016/0254684 A1 * | 9/2016 | Gothoskar | ............ | H02J 7/0021 |
| | | | | 455/572 |
| 2016/0311094 A1 * | 10/2016 | Mergener | .................. | B25F 5/00 |
| 2017/0013369 A1 * | 1/2017 | Renken | ............. | G01R 31/3689 |
| 2017/0077722 A1 * | 3/2017 | Jung | ..................... | H02J 7/0021 |

OTHER PUBLICATIONS

Anton/Bauer, Battery Management System Manual, date unknown.

* cited by examiner

*Primary Examiner* — Nathaniel Pelton
(74) *Attorney, Agent, or Firm* — Robert J. Hess; Hess Patent Law Firm

(57) ABSTRACT

A wireless system for monitoring rechargeable and single-use batteries. The wireless system is usable with existing batteries that implement a smart battery standard and/or an analog port. The wireless system may be installed in the battery, in a battery-powered device, in a battery mount plate, in an attachment that connects to an analog port and/or in a battery charging station or charging device. The wireless system transmits the battery's status to a remote user device, which may be a tablet, smartphone or other wireless device. The system allows a user to monitor one or more batteries remotely.

7 Claims, 9 Drawing Sheets

WIRELESS SMART BATTERY SYSTEM

FIELD OF THE INVENTION

The present invention relates to rechargeable battery systems such as those used for electronic devices including, without restriction, cameras, computers, medical and audiovisual equipment.

The present invention is a wireless communication system for batteries and battery-powered systems that includes a network connection element that transmits information regarding the battery to one or more electronic devices. The present invention may be integrated into the battery, integrated into an electronic device powered by a battery or may be an attachment for such an electronic device that interoperates with the battery powering the device.

BACKGROUND OF THE INVENTION

Many devices, including computers, cameras, lights, phones, radios and other equipment, use rechargeable batteries for power. These batteries typically attach to the device by mechanical latches or connections. In particular, in many items of audiovisual recording equipment, a rechargeable battery attaches to a battery mount plate which is attached to the device, which incorporates the power terminals that receive power from the battery and data terminals for communication between the battery and the device. Such battery mount plates are attached semi-permanently to the audiovisual recording equipment and provide an industry-standard mounting surface which a rechargeable battery may be quickly and easily attached to or detached from. Such industry-standard mounting surfaces include, without restriction, 3-stud mounts and V-mounts. Some rechargeable batteries may be recharged through the device, while others may be recharged through a dedicated charging device, and some batteries may be recharged either through the device or through a dedicated charging device.

Many currently available rechargeable batteries include sub-systems that enable battery management, reporting or other features referred to as smart battery features. Such smart battery features may report the current battery charge, power and other state information. Such smart battery features may also report information such as current battery load, time until the battery is charged when charging, or time until the battery is discharged when in use. Smart battery features may also allow the user to manage the battery by monitoring its output voltage, reserve power, or alerts. Dedicated charging devices may also incorporate smart battery features.

Smart battery features are usually implemented using the System Management Bus ("SMBus") standard, which allows communication between a computer processor and computer hardware. In addition to the SMBus standard, other standards including, without restriction, the Power Management Bus ("PMBus"), Smart Battery System ("SBS"), HDQ and Inter-Integrated Circuit ("I2C") are used by various manufacturers to allow communication between a battery and a computer processor or device. These standards may be referred to as smart battery management standards. As used herein, the term smart battery management standards also includes analogue connections that communicate only one battery attribute such as voltage and/or amperage.

Current smart battery management standards all rely on a directly wired connection between the smart battery and the device receiving the information regarding smart battery features and/or managing the smart battery. This architecture is acceptable when a single device is powered by the battery and manages the battery. In an environment, however, where the device powered by the battery is not directly attended by a user or where a user is using multiple battery-powered devices at once, this can result in a device unexpectedly shutting off as its battery runs out of power. Additionally, it prevents the use of smart battery features on devices that do not incorporate computer processors and/or displays. Current smart battery features and systems cannot report or otherwise communicate battery status to device other than a device the battery is connected to by a wired connection. Further, multiple smart batteries or smart battery systems do not aggregate the statuses of their batteries or offer an interface where a user can review the status of multiple batteries at once. This can be a problem in a workplace or other setting where multiple devices, each powered by one or more rechargeable batteries, are all continuously or intermittently operating, and the loss of power to one device can interrupt work or other tasks. Additionally, devices that do not implement fully-featured smart battery communication systems may only communicate particular attributes, such as voltage or amperage, via an analogue port or connector. The current invention solves these problems.

SUMMARY OF THE INVENTION

The current invention is a wireless smart battery communication system, incorporating a processor, a connector complying with a smart battery management standard and a wireless communication system. The wireless smart battery connector allows a user to view the status of one or more smart batteries using a wireless device. Multiple smart battery communication systems, each connected to and/or incorporating one smart battery, may be connected to a single wireless device. The preferred embodiment of the invention is a smart battery connector incorporated into a battery mount plate that connects a device and a smart battery. The current invention allows a user to remotely and wirelessly monitor and manage multiple smart batteries powering multiple devices and/or being recharged in devices or dedicated charging devices.

The preferred embodiment of the invention is a battery mount plate that includes a battery power terminal, a device power terminal, a battery communication terminal, a device communication terminal, a processor, a wireless communication system and a battery mounting system. All of the foregoing are incorporated into a housing having two sides, which is configured to semi-permanently attach to a device requiring power, such as by screws, and releasably attach to a rechargeable battery, such as by, without restriction, latches or other mechanical mounting. The battery power terminal, battery communication terminal and battery mounting system are disposed on a battery side of the housing and the device power terminal and device communication terminal are disposed on a device side of the housing. In this configuration, the invention is semi-permanently affixed to the device and a smart battery is releasably attached to the invention such that electrical power flowing from the battery to the device or from the device to the battery passes through the invention and communications passing from the battery to the device or from the device to the battery pass through the invention. In a related embodiment, the processor and wireless communication system are directly incorporated into the battery housing and receive battery information and/or communications directly from the internal battery systems.

Information regarding power and/or communications passing through the invention may then be processed by the processor and transmitted using the wireless communication system to any system or device capable of receiving wireless communications. Such a device may be a computer, tablet or smartphone device with an application installed for presenting the received information to a user.

Another embodiment of the invention is a battery charger with a processor, wireless communication system, battery power terminal, battery communication terminal and battery mounting system integrated into the battery charger. In this embodiment, information regarding battery power and/or communications between the charger and a connected battery may then be processed by the processor and transmitted using the wireless communication system to any system or device capable of receiving wireless communications.

A third embodiment of the invention is a smart battery module attachable to a battery by a standard analogue port. In this embodiment, the module incorporates a processor, wireless communication system and battery connector into a housing. When the module is connected to a battery

BRIEF DESCRIPTION OF THE DRAWINGS

For a more complete understanding of the present invention, reference may be had to the following detailed description of the invention taken in conjunction with the drawings herein, of which.

DETAILED DESCRIPTION OF THE INVENTION

Figure 1A:
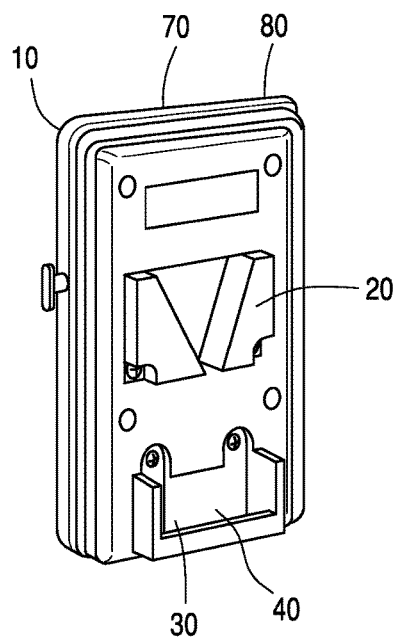
FIG. 1A is a rear view of the preferred embodiment of the current invention configured for v-mount batteries.
Figure 1B:
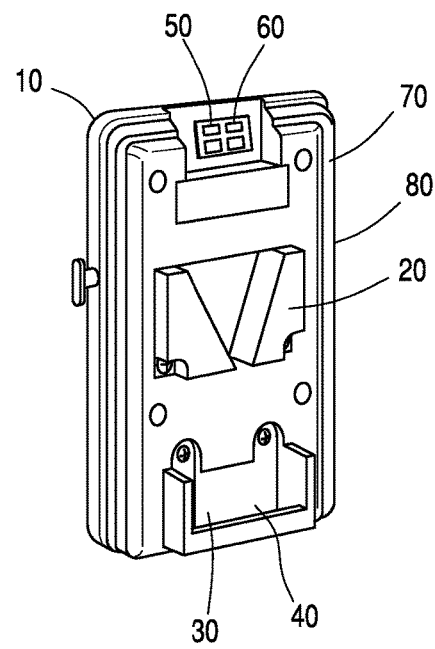
FIG. 1B is a rear cutaway view of the preferred embodiment of the current invention configured for v-mount batteries.
Figure 2A:
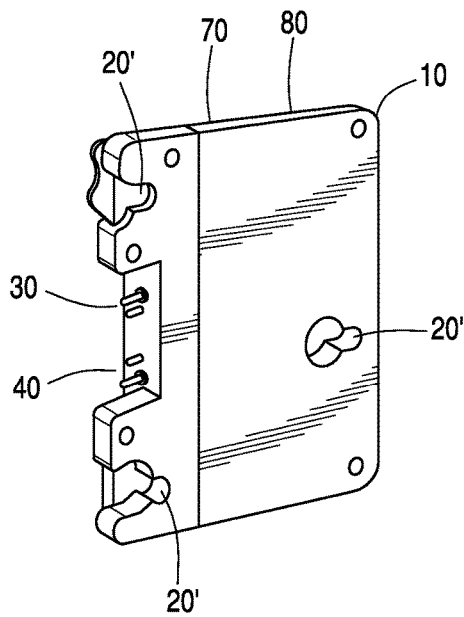
FIG. 2A is a rear view of the preferred embodiment of the current invention configured for 3-stud batteries.
Figure 2B:
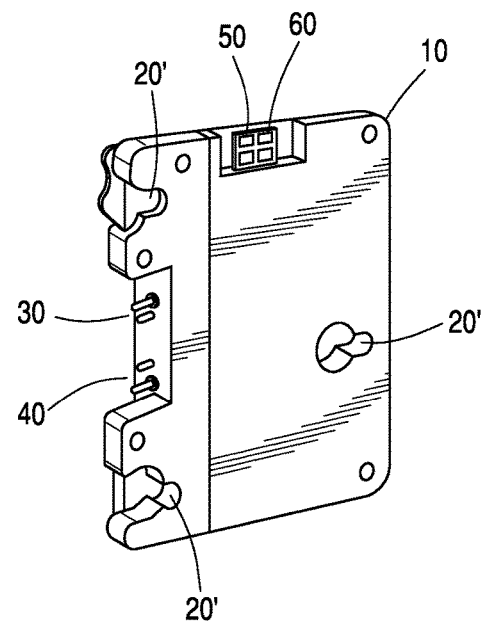
FIG. 2B is a rear cutaway view of the preferred embodiment of the current invention configured for 3-stud batteries.
Figure 5:
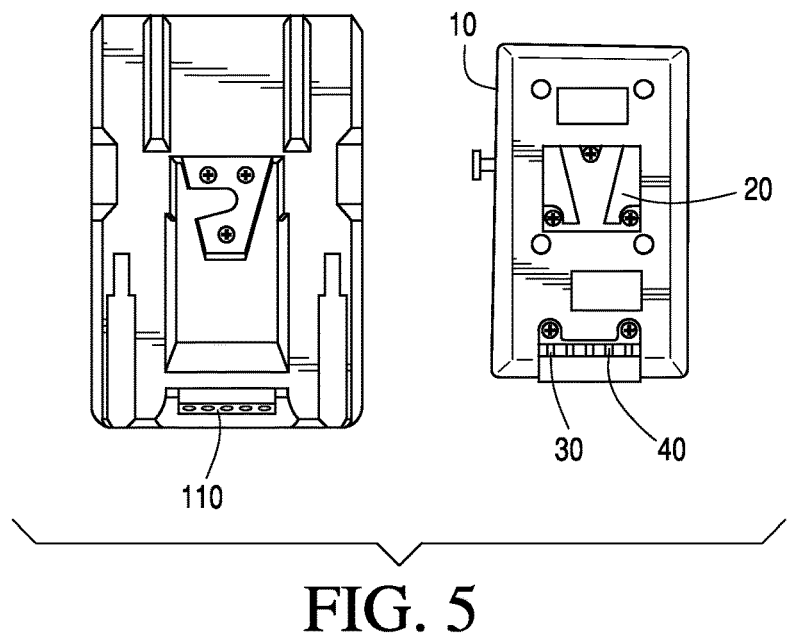
FIG. 5 is a front view of the embodiment of FIG. 1A.
Figure 6:
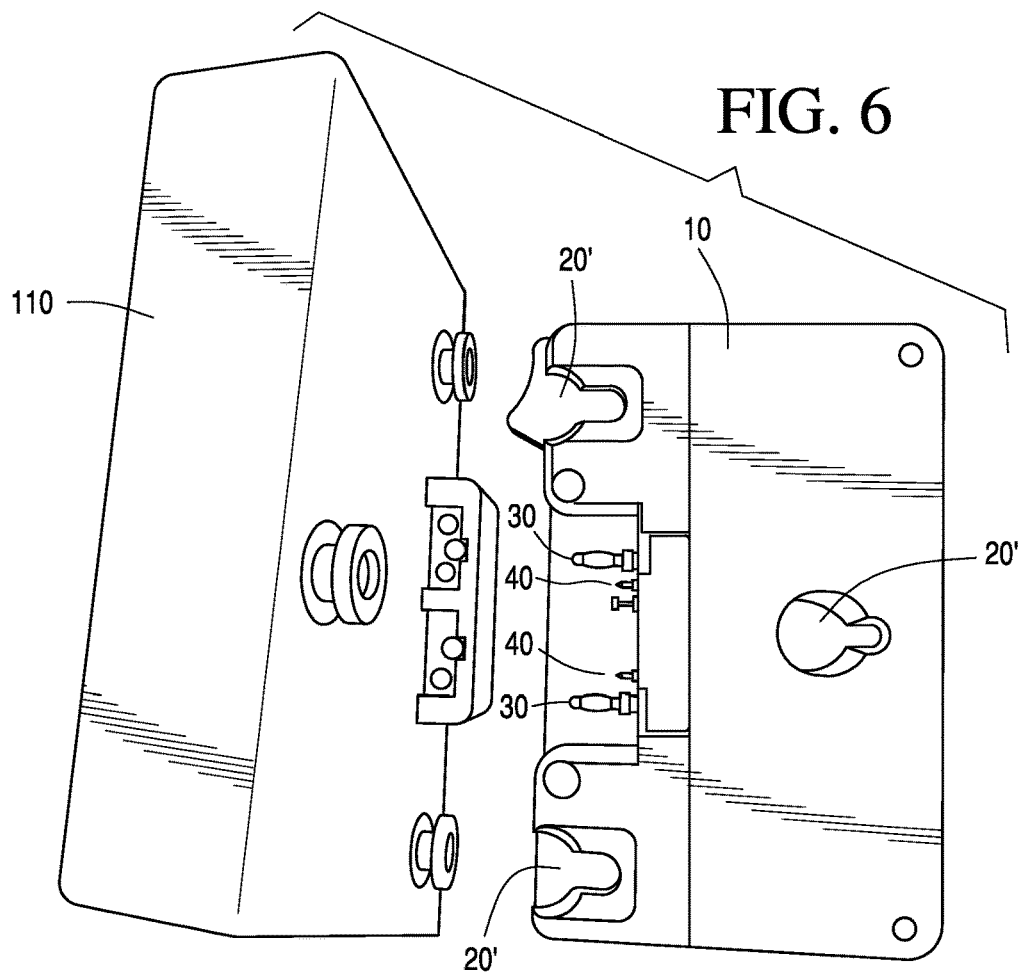
FIG. 6 is a front view of the embodiment of FIG. 2A.
Figure 7A:
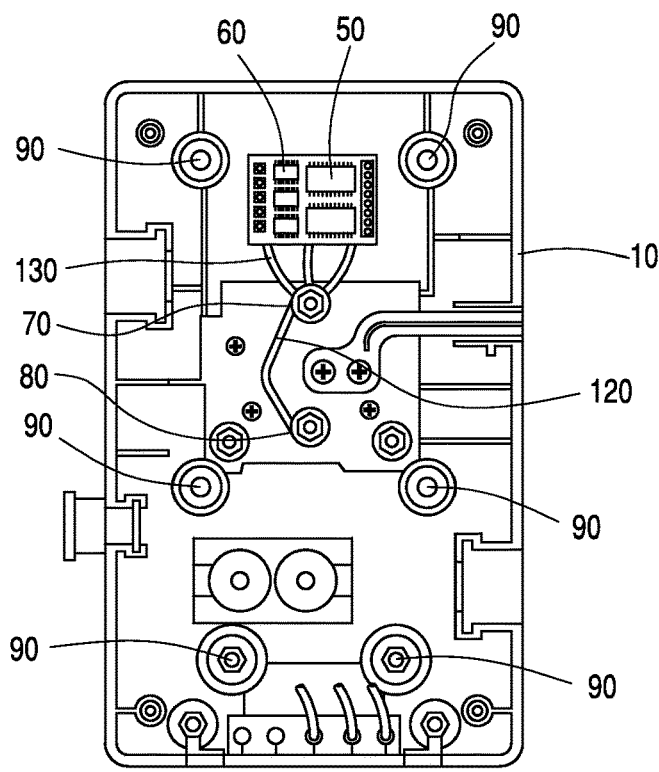
FIG. 7A is a rear view of the embodiment of FIG. 1A.
Figure 7B:
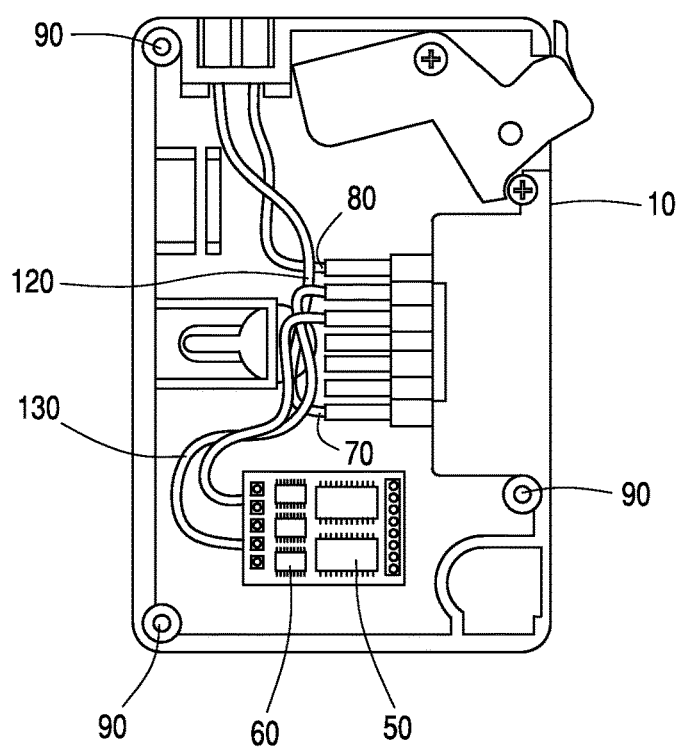
FIG. 7B is a rear view of the embodiment of FIG. 2A.

In a first embodiment, as depicted in FIGS. 1A, 1B, 2A and 2B, the present invention comprises a mount plate housing 10, a battery attachment mount 20, a battery power terminal 30, a battery communication terminal 40, a wireless communication systems 50, a processor 60, a device power terminal 70 and a device communication terminal 80. The mount plate housing 10 is of similar size, shape and design to the battery mount plates known to those skilled in the relevant art and used in the audiovisual recording industry. The battery attachment mount 20 may be an industry-standard V-mount 20 as shown in FIG. 1A and FIG. 1B, a 3-stud mount 20' as shown in FIG. 2A and FIG. 2B or any other system or mechanism for attaching a battery to a mount plate. The battery power terminal 30 is located and configured as standard for the type of battery attachment mount 20 used. The battery power terminal 30 is a plurality of connectors such as, without restriction, prongs, contacts or sockets that connect to connectors on a rechargeable battery 110 as shown in FIG. 5 and FIG. 6. Preferably, the battery power terminal 30 is a negative and a positive connector. The battery communication terminal 40 is located and configured as standard for the type of battery attachment mount 20 used. The battery communication terminal 40 is one or more connectors such as, without restriction, prongs, contacts or sockets that connect to connectors on a rechargeable battery. Preferably, the battery communication terminal 40 is an SMBus-compliant DATA connector and CLOCK connector. The battery communication terminal 40 may also be, without restriction, a single-wire connection such as HDQ or an analog voltage output. The wireless communication system 50 is disposed inside the battery mount plate housing 10 and may be any wireless communication device including, without restriction, a chip or chipset implementing any version of the Bluetooth standard and/or any version of the WiFi standard, but is preferably a chip implementing the Bluetooth 4.0 (also known as Bluetooth Low Energy or Bluetooth Smart) standard. The processor 60 is disposed inside the battery mount plate housing 10 and may be any microprocessor capable of receiving data from the battery communication terminal 40. The processor 60 is connected to the battery power terminal 30, the battery communication terminal 40 and the wireless communication system 50. The processor 60 may be disposed on the same circuit board or in the same chip or chipset as the wireless communication system 50. As depicted in FIG. 7A and FIG. 7B, the present invention further comprises a device power terminal 70, a device communication terminal 80 and device attachment means 90. FIG. 7A and FIG. 7B also show alternative positions of the wireless communication systems 50 and the processor 60 inside the mount plate housing 10.

Figure 4:
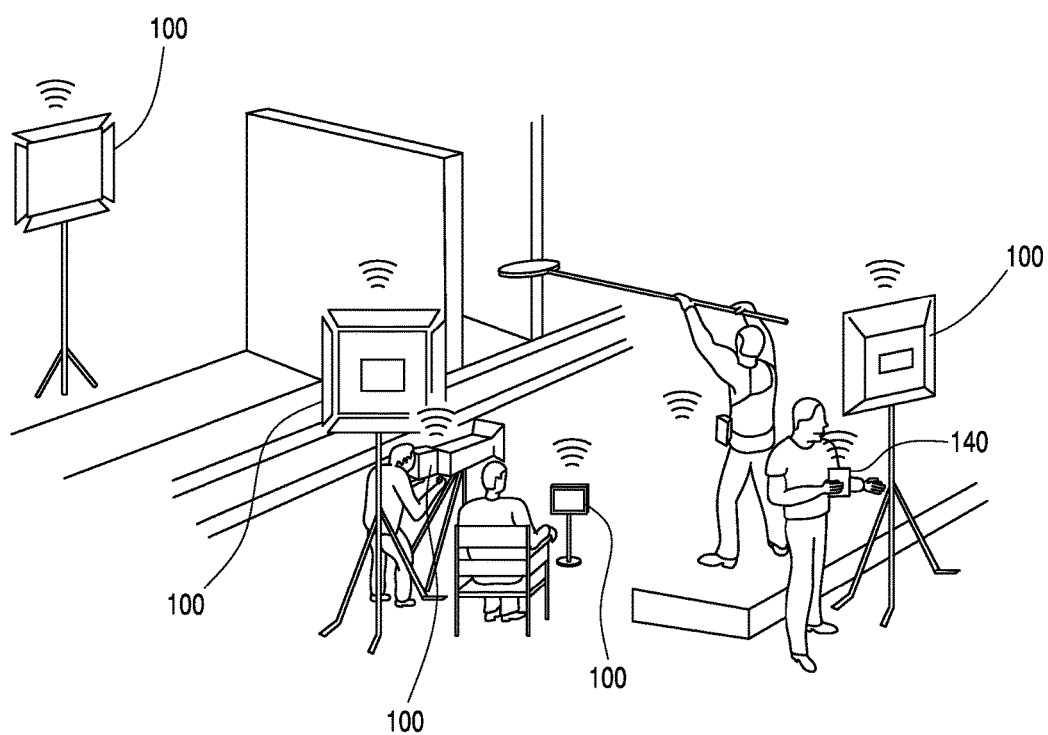
FIG. 4 is a schematic view of a workplace using multiple devices incorporating the current invention.

Turning to FIG. 4, a workplace is shown with multiple devices 10 that are battery-powered, audiovisual recording industry devices. The devices 100 shown are lighting devices such as on-location lights for video production, an audio device for video production, a camera or a camcorder for video production such as a professional and cinematic camcorder, and a video screen or a video recorder for video production.

Figure 3A:
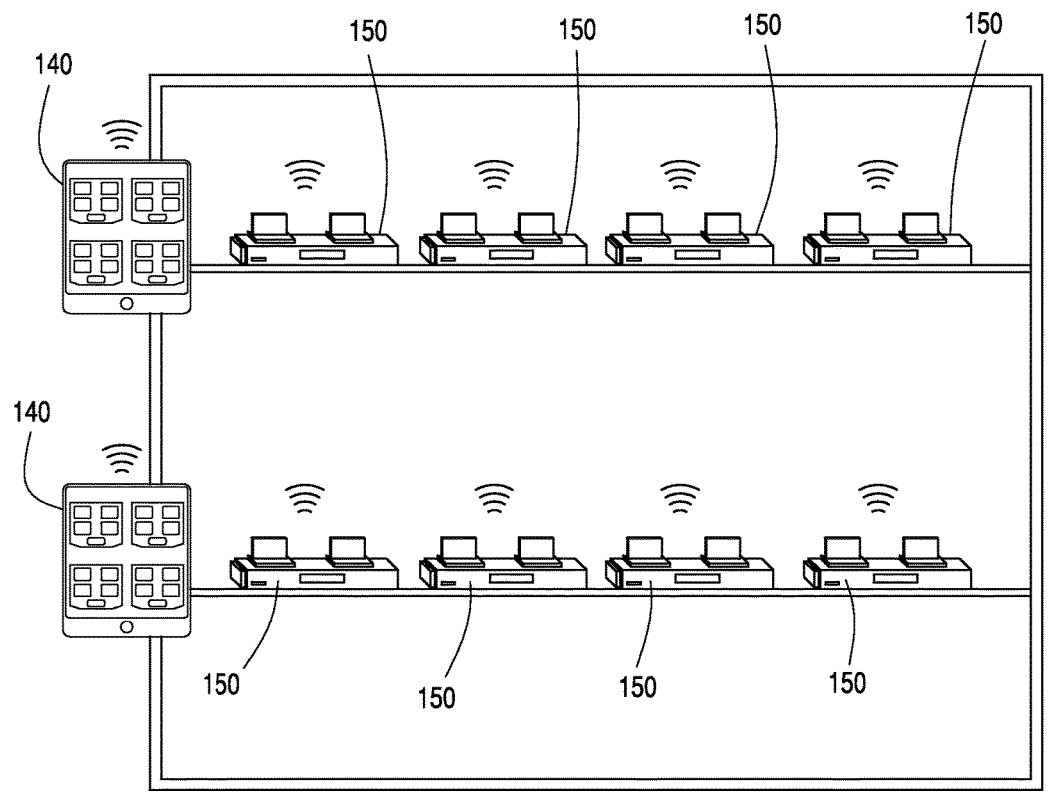
FIG. 3A is a schematic view of multiple battery charging devices incorporating the current invention.
Figure 3B:
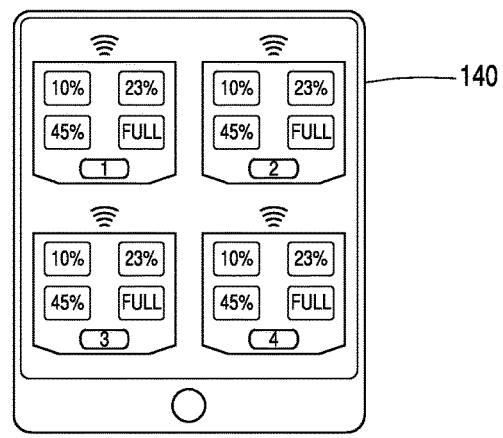
FIG. 3B is a plan view of a tablet communicating with the current inventions depicted in FIG. 3A.

The battery-powered, audiovisual recording industry devices 100 are powered by a plurality of batteries, whose charge status or attributes are each displayed simultaneously on a screen display of the user device 140 of FIG. 4. The display of the screen display of the user device 140 is depicted in FIG. 3A and FIG. 3B. That is, the display is a simultaneous depiction indicative of the status and attributes of each battery attached to each wireless smart battery connector of each of the audiovisual recording industry devices 100.

Figure 8A:
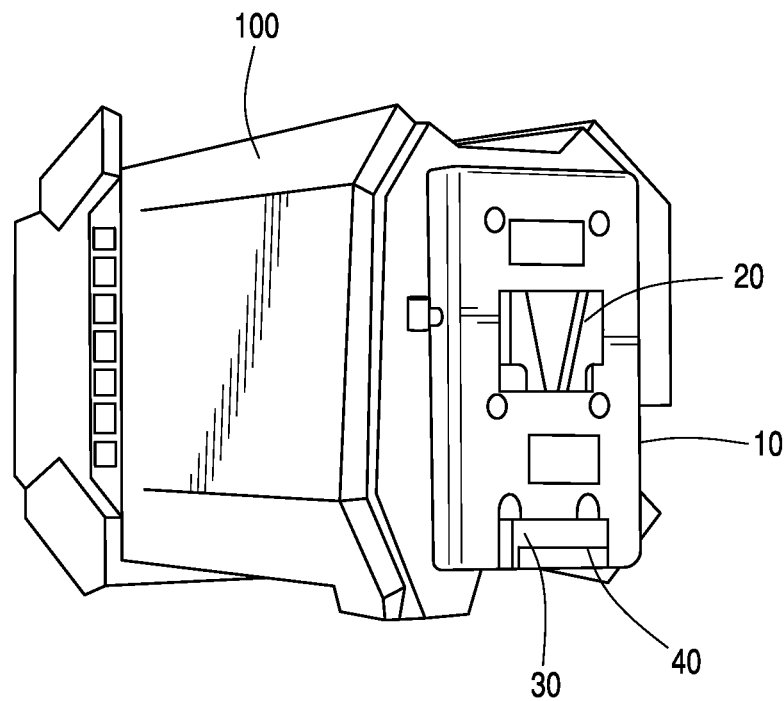
FIG. 8A is a perspective view of the embodiment of FIG. 1A attached to a powered device.
Figure 8B:
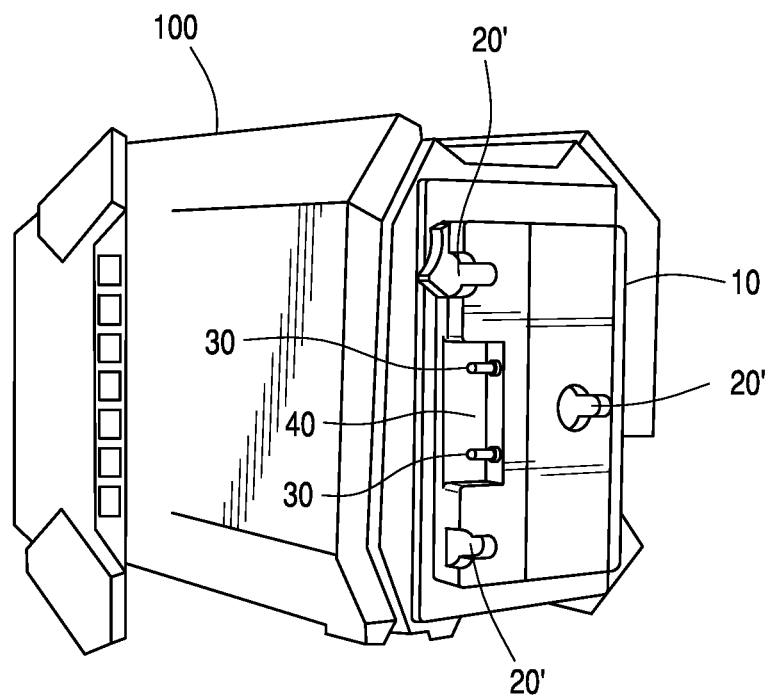
FIG. 8B is a perspective view of the embodiment of FIG. 1B attached to a powered device

Turning now to FIG. 8A, when the battery mount plate housing 10 is attached to a device 100 by device attachment means 90, the device power terminal 70 and the device communication terminal 80 connect to the device 100. When a rechargeable battery 110 is mounted on the battery mount plate housing 10 by the battery attachment mount 20, the battery power terminal 30 and the battery communication terminal 40 connect to the rechargeable battery 110. The battery power terminal 30 and the device power terminal 70 are connected so that a power circuit 120 is created between the rechargeable battery 110 and the device 100. The processor 60 is connected to power circuit 120 and powered by power circuit 120. The battery communication terminal 40 and the device communication terminal 80 are connected so that a communication circuit 130 is created between the rechargeable battery 110 and the device 100. The processor 60 is connected to communication circuit 130 and receives all information sent between the rechargeable battery 110 and the device 100. The processor 60 is connected to the wireless communication system 50. The wireless communication system 50 is connected to power circuit 120 and powered by power circuit 120. The processor 60 processes information sent between the rechargeable battery 110 and the device 100 and transmits the result of said processing to the wireless communication system 50 and/or relays information sent between the rechargeable battery 110 and the device 100 to the wireless communication system 50 without processing it first. The wireless communication system 50 transmits information regarding the rechargeable battery 110 to a user device 140 to which it is wirelessly connected.

Figure 11:
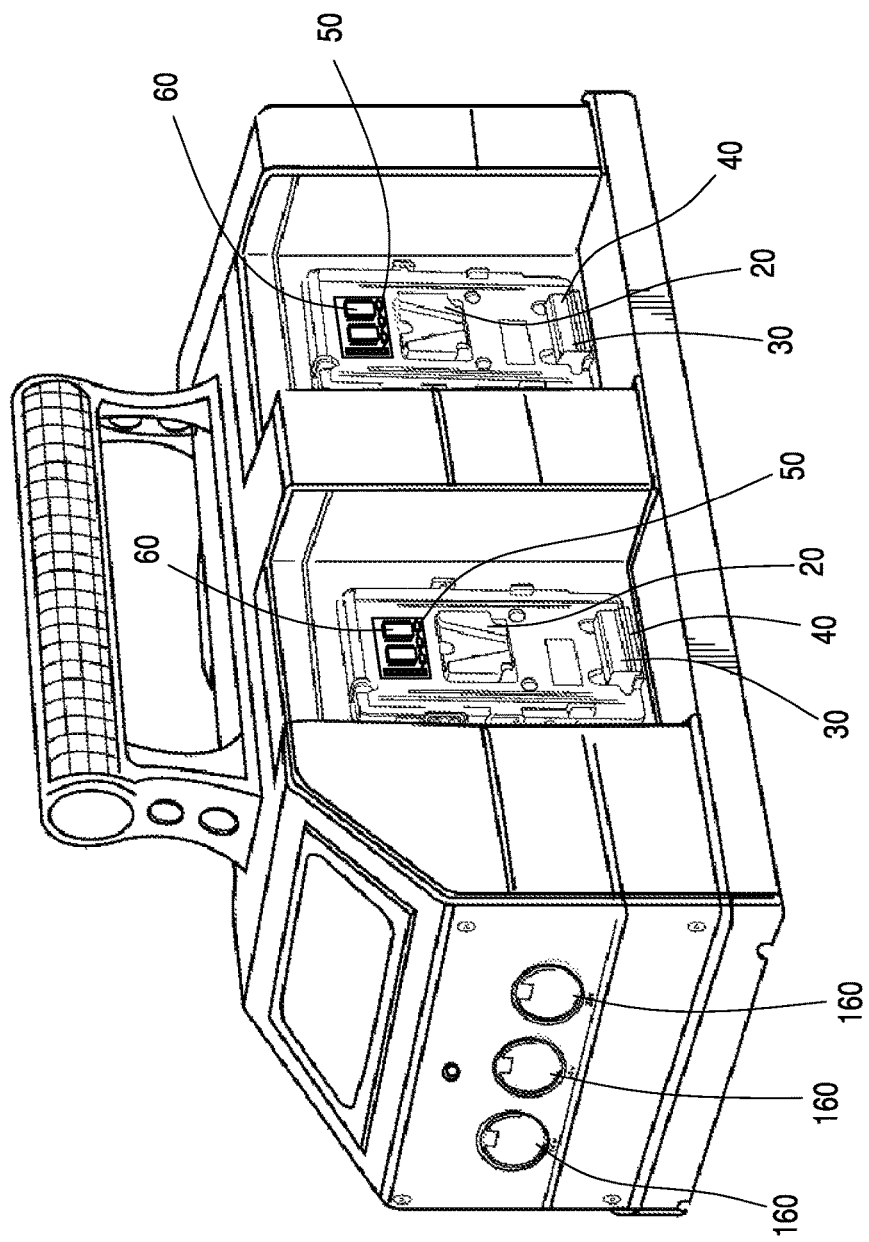
FIG. 11 is a side perspective view of an alternate embodiment of the embodiment of FIG. 3A.

In another embodiment of the invention as shown in FIG. 3A, the battery power terminal 30, the battery communication terminal 40, the wireless communication system 50 and the processor 60 are incorporated into a charger housing 150. The charger housing 150 also incorporates a power connector 160. FIG. 11 shows an alternate configuration of the battery charger embodiment of the invention shown in FIG. 3A. In preferred embodiments of the battery charger embodiment of the invention, power connector 160 plugs directly into a power outlet, preferably a standard U.S. 110 volt power outlet, but this embodiment may, without restriction, connect to a DC converter, be configured for any power outlet or connect to any other power source, including large batteries, generators, solar power, or any other source of power that may be connected to provide power to the invention. The power connector 160 is connected to the battery power terminal 30 and provides power at the correct voltage and amperage to charge the rechargeable battery 110. When the rechargeable battery 110 is seated in the charger housing 150 so that it connects to the battery power terminal 30 and the battery communication terminal 40, it can receive power from through the battery power terminal 30 and communicate status through the battery communication terminal 40. The processor 60 processes status information communicated by the rechargeable battery 110 and transmits the result of said processing to the wireless communication system 50 and/or relays information to the wireless communication system 50. The wireless communication system 50 transmits information regarding the rechargeable battery 110 to a user device 140 to which it is wirelessly connected.

Figure 9:
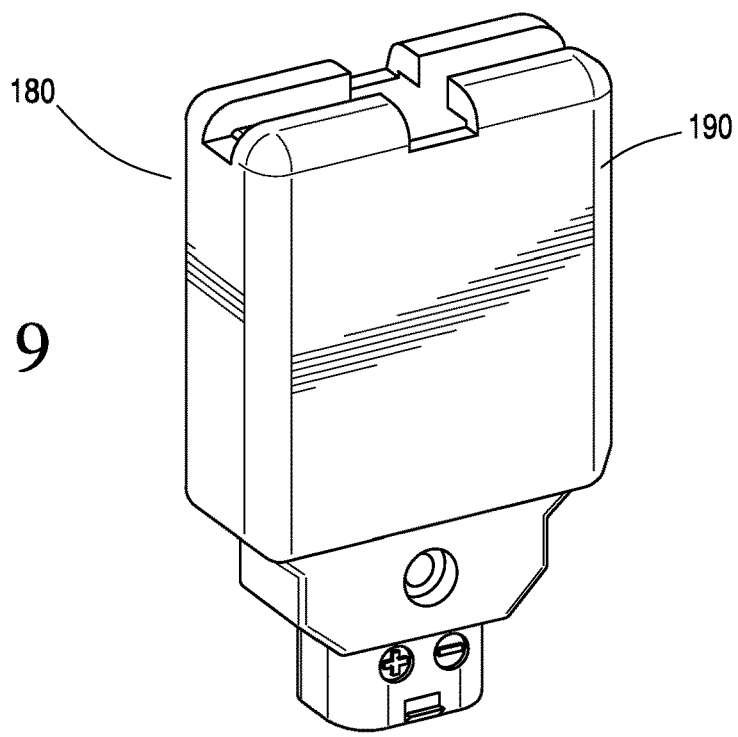
FIG. 9 is a perspective view of a dongle embodiment of the present invention.
Figure 10:
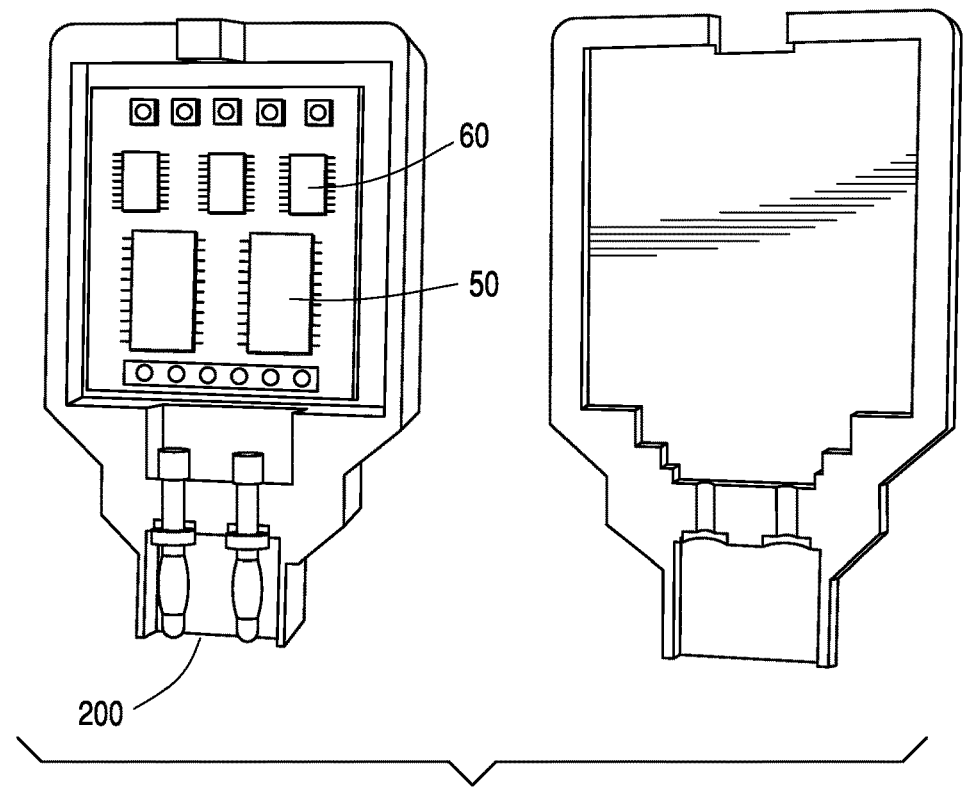
FIG. 10 is a cutaway view of the dongle embodiment of the present invention.

In another embodiment of the invention, as shown in FIG. 9 and FIG. 10, a dongle 180 is comprised of a housing 190 formed to connect to a battery analog port of a rechargeable battery 110. Said analog port may, without restriction, also function as an auxiliary power output. The housing 190 encloses an analog connector 200 disposed in the portion of the housing 190 formed to connect to the battery analog port, a processor 60 connected to said analog connector 200 and a wireless communication system 50 connected to said processor. The analog connector 200 may receive information from the battery analog port in the form of, without restriction, voltage levels and amperage.

Figure 12:
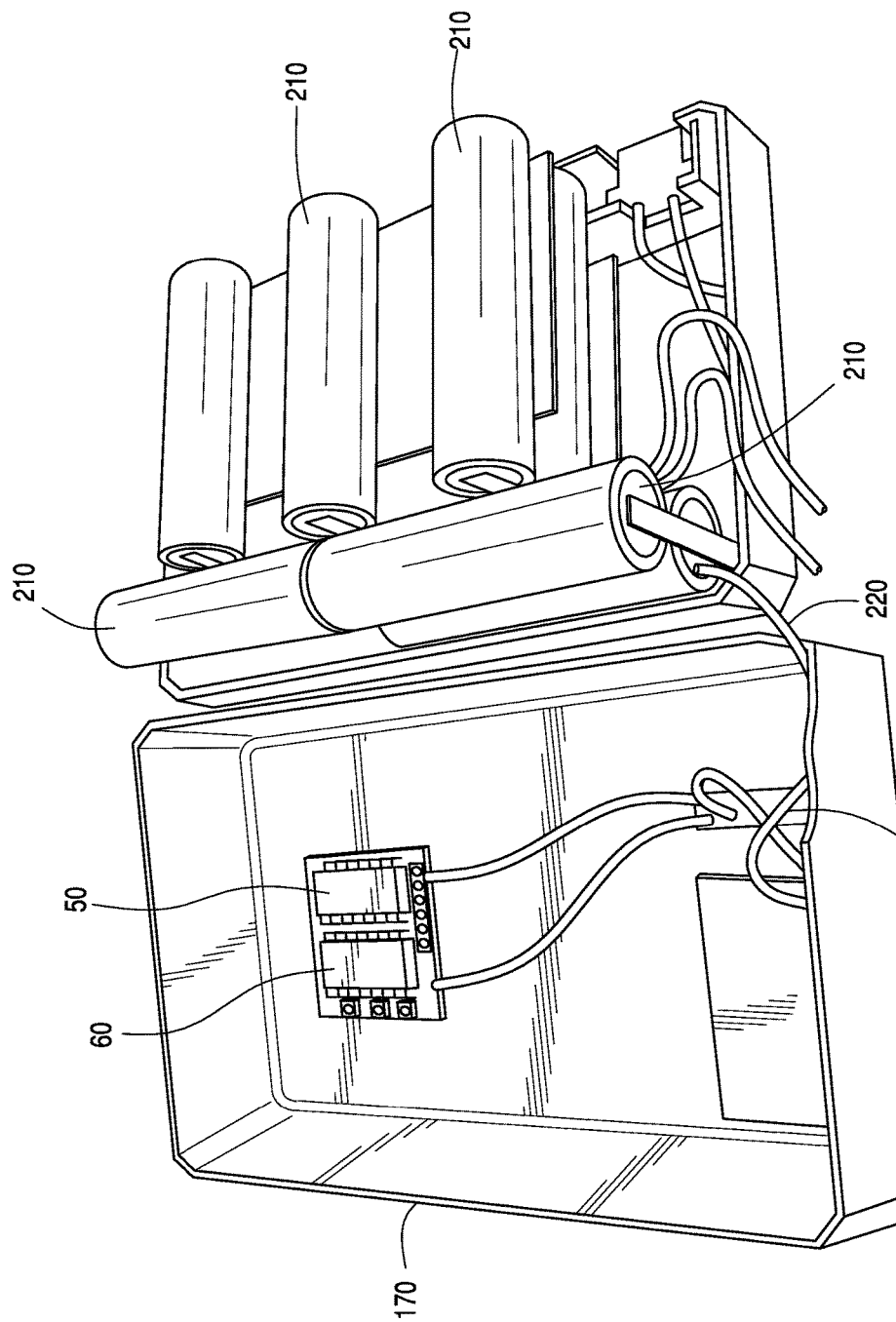
FIG. 12 is an exploded view of a battery pack embodiment of the present invention.

In another embodiment of the invention, as shown in FIG. 12, the processor 60 and wireless communication system 50 are disposed inside of the housing 170 of a battery 110. The housing includes one or more battery cells 210 that are connected to a power circuit 220, which terminates at a power terminal 230. By attaching a device 100 to the battery 110 by connecting to power terminal 230, the battery 110 provides power to the device 100. The processor 60 and wireless communication system 50 are attached to and receive power from power circuit 220. The processor 60 detects and processes information regarding the battery 110 from the power circuit 220. Such information can include current voltage, amperage, charge level and/or any other information that can be determined by an electrical connection to a battery cell. As in the other embodiments of the invention, the wireless communication system 50 receives said information from the processor 60 and transmits information regarding the rechargeable battery 110 to a user device 140 to which it is wirelessly connected.

In all embodiments of the invention, the user device 140 may be any device capable of receiving wireless signals, preferably a tablet capable of acting as a Bluetooth 4.0 client as depicted in FIG. 3B. The user device 140 may also be, without restriction, a smartphone, a desktop computer or a wireless hub. Each user device 140 may connect wirelessly to multiple wireless communication systems 50, each such wireless communication system 50 incorporated into a battery mount plate housing 10, charger housing 150, dongle housing 190 or other housing incorporating a wireless communication system 50 and connecting to a rechargeable battery 110.

The user device 140 displays to the user the status of each battery attached to each wireless smart battery connector. The status can include, without restriction, the current charge of each rechargeable battery 110, whether each device 100 is currently operating, the time until charged for any rechargeable batteries 110 that are charging, and the time until discharge for any rechargeable batteries 110 that are powering devices 100. The user device 140 may also act as a network hub and allow a user to connect to it via a network to view the foregoing information. The user is thereby enabled to view the status of multiple rechargeable batteries 110 without needing to examine each rechargeable batteries 110 and/or devices 100 and, furthermore, can obtain such information while at a single location, whereas the rechargeable batteries 110 and/or devices 100 may be spread across a workplace.

While the foregoing description and drawings represent the preferred embodiments of the present invention, it will be understood that various changes and modifications may be made without departing from the scope of the present invention.

What is claimed is:
1. A wireless battery monitoring system, comprising:
a remote device having a display screen that shows simultaneously in the display screen attributes and status of a plurality of batteries, the remote device being configured to receive signals from a plurality of wireless communication systems that pertain to attributes or status of the plurality of batteries;
a battery power connector configured to make an electrical connection with a power terminal of a battery;
a battery data connector configured to make a connection with a data terminal of the battery;

a processor connected to said battery power connector to receive power from the battery, said processor also being connected to said battery data connector to receive and process data that pertains to attributes or status of the battery and that is transmitted by the battery via the data terminal of the battery;

a wireless communication system connected to said processor and configured to receive signals from said processor and to wirelessly transmit the received signals to the remote device;

a device power connector electrically connected to said battery power connector and configured to make an electrical connection with a power terminal of a battery-powered device so as to receive power from the battery via the power terminal of the battery and to provide power to the battery-powered device via the power terminal of the battery-powered device;

a device data connector connected to said battery data connector and configured to make a connection with a data terminal of the battery powered device so as to transmit the data that pertains to the battery to the battery powered device via the data terminal of the battery powered device; and a mounting surface configured to mount the battery in a manner that connects said battery power connector to said device power connector and connects said battery data connector to said device data connector, the mounting surface being selected from the group consisting of a V-Mount, three-stud mount and other audiovisual recording industry standard mounting surface.

2. The system of claim 1, wherein said wireless communication system comprises a chip or chipset implementing a wireless standard.

3. The system of claim 1, further comprising:

a plurality of battery-powered, audiovisual recording industry devices that are selected from the group consisting of lighting devices, an audio device for video production, a camera or a camcorder for video production, a video screen or a video recorder for video production, the plurality of battery-powered, audiovisual recording devices being powered by the plurality of batteries, the display screen of the remote device showing attributes and status of batteries that are powering the battery-powered, audiovisual recording industry devices.

4. The system of claim 1, further comprising:

a plurality of battery-powered, audiovisual recording industry devices selected from the group consisting of an on-location light for video production, an on-location audio recording device for video production, a professional and cinematic camcorder for video production and an electronic visual display for video production, the battery-powered, audiovisual recording industry devices being powered by the plurality of batteries, the display screen of the remote device showing attributes and status of the plurality of batteries that are powering the battery-powered, audiovisual recording industry devices.

5. A wireless battery monitoring system, comprising:

a remote device having a display screen that shows simultaneously in the display screen attributes and status of a plurality of batteries, the remote device being configured to receive signals from a plurality of wireless communication systems that pertain to attributes or status of the plurality of batteries;

a plurality of battery-powered, audiovisual recording industry devices selected from the group consisting of lighting devices, an audio device for video production, a camera or a camcorder for video production, a video screen or a video recorder for video production, the plurality of battery-powered, audiovisual recording industry devices being powered by the plurality of batteries; and a battery power connector configured to make an electrical connection with a power terminal of a battery that powers at least one of the plurality of battery-powered, audiovisual recording industry devices;

a battery data connector configured to make a connection with a data terminal of the battery;

a processor connected to said battery power connector to receive power from the battery, said processor also being connected to said battery data connector to receive and process data that pertains to attributes or status of the battery and that is transmitted by the battery via the data terminal of the battery;

a wireless communication system connected to said processor and configured to receive signals from said processor and to wirelessly transmit the received signals to the remote device;

a device power connector electrically connected to said battery power connector and configured to make an electrical connection with a power terminal of a battery-powered device so as to receive power from the battery via the power terminal of the battery and to provide power to the battery-powered device via the power terminal of the battery-powered device;

a device data connector connected to said battery data connector and configured to make a connection with a data terminal of the battery powered device so as to transmit the data that pertains to the battery to the battery powered device via the data terminal of the battery powered device; and a mounting surface configured to mount the battery in a manner that connects the battery power connector to the device power connector and that connects the battery data connector to the device data connector, the mounting surface being selected from the group consisting of a V-mount a three-stud mount, and other audiovisual recording industry standard mounting surface.

6. The system of claim 1, wherein the battery is rechargeable, the processed data that pertains to the battery including indications of current charge of the rechargeable battery, current operation of the battery powered device, time until the rechargeable battery is charged, and time until discharge for the rechargeable battery that is powering the battery powered device.

7. The system of claim 5, wherein the battery-powered, audiovisual recording industry devices are selected from the group consisting of an on-location light for video production, an on-location audio recording device for video production, a professional and cinematic camcorder for video production and an electronic visual display for video production.

* * * * *